United States Patent
Sadhu et al.

(10) Patent No.: US 12,301,168 B2
(45) Date of Patent: May 13, 2025

(54) FREQUENCY CONTROL IN A MULTI-MODE VCO

(71) Applicant: INTERNATIONAL BUSINESS MACHINES CORPORATION, Armonk, NY (US)

(72) Inventors: Bodhisatwa Sadhu, Peekskill, NY (US); Herschel Akiba Ainspan, New Hempstead, NY (US); Zheng Xu, Wappingers Falls, NY (US); Armagan Dascurcu, New York, NY (US); Gary Kurtzman, Lago Vista, TX (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 9 days.

(21) Appl. No.: 18/301,200

(22) Filed: Apr. 14, 2023

(65) Prior Publication Data
US 2024/0348257 A1   Oct. 17, 2024

(51) Int. Cl.
*H03B 5/12* (2006.01)

(52) U.S. Cl.
CPC ......... *H03B 5/1296* (2013.01); *H03B 5/1228* (2013.01); *H03B 5/124* (2013.01); *H03B 5/1256* (2013.01)

(58) Field of Classification Search
CPC .............. H03B 5/1296; H03B 5/1228; H03B 5/1215; H03B 5/1212; H03B 5/124; H03B 5/1243; H03B 5/1256
See application file for complete search history.

(56) References Cited

U.S. PATENT DOCUMENTS 6,621,365 B1 * 9/2003 Hallivuori ............ H03B 5/1212
                                                                     331/181
7,423,495 B2   9/2008 Bevilacqua
(Continued)

FOREIGN PATENT DOCUMENTS

WO   2014150614 A2   9/2014

OTHER PUBLICATIONS

Cannone, F. et al., "Analysis and design of wideband distributed VCOs based on switched-cells tuning technique", Analog Integr Circ Sig Process (2015); vol. 84, pp. 43-51.
(Continued)

*Primary Examiner* — Ryan Johnson
(74) *Attorney, Agent, or Firm* — Intelletek Law Group, PLLC; Gabriel Daniel, Esq.

(57) ABSTRACT

A Voltage-Controlled Oscillator (VCO) includes a cross-coupled transconductance cell. A transformer comprising a primary coil and at least one secondary coil, wherein the primary coil is connected to the cross-coupled transconductance cell. A primary coil varactor is connected to the cross-coupled transconductance cell in parallel to the primary coil. A variable inductive tuning component connected to the at least one secondary coil. A mode switch connected to the at least one secondary coil and configured to select a frequency mode of operation of the VCO by engaging or disengaging the variable inductive tuning component from operation with the primary coil varactor to generate oscillation at a center frequency of the VCO.

22 Claims, 9 Drawing Sheets

(56) References Cited

U.S. PATENT DOCUMENTS

| | | | | |
|---|---|---|---|---|
| 7,633,352 | B2* | 12/2009 | El Rai | H03J 3/20 |
| | | | | 331/36 L |
| 8,044,732 | B2 | 10/2011 | Kossel | |
| 8,212,625 | B2 | 7/2012 | Lee | |
| 8,436,689 | B2 | 5/2013 | Lee | |
| 9,325,332 | B2 | 4/2016 | Ainspan et al. | |
| 10,447,204 | B2 | 10/2019 | Moslehi Bajestan | |
| 10,637,487 | B1 | 4/2020 | Garampazzi | |
| 11,270,838 | B2 | 3/2022 | Mikhael | |
| 2006/0033587 | A1* | 2/2006 | Cabanillas | H03B 5/1212 |
| | | | | 331/108 C |
| 2008/0136544 | A1* | 6/2008 | Tang | H03B 5/1215 |
| | | | | 331/177 V |
| 2013/0285756 | A1* | 10/2013 | Chen | H03B 5/1228 |
| | | | | 331/117 R |
| 2013/0307630 | A1* | 11/2013 | Ma | H03B 5/1296 |
| | | | | 333/167 |

OTHER PUBLICATIONS

Ferris, M. et al., "A 12-to-26GHz Fractional-N PLL with Dual Continuous Tuning LC-D/VCOs"; IEEE (2016); pp. 196-198.

Ferris, M. et al., "A 13.1-to-28GHz Fractional-N PLL in 32nm SOI CMOS with a ΔΣ Z Noise-Cancellation Scheme", IEEE (2015); pp. 192-194.

Berny A. D., et al., "A 1.8-GHz LC VCO With 1.3-GHz Tuning Range and Digital Amplitude Calibration"; IEEE Journal of Solid State Circuits (2005); vol. 40:4, pp. 909-917.

Sadhu, B. et al., A 3-Band Switched-Inductor LC VCO and Differential Current Re-Use Doubler Achieving 0.7-to-11.6 GHz Tuning Range, 2015 IEEE Radio Frequency Integrated Circuits Symposium (2015); pp. 191-194.

Sadhu, B. et al., "A Capacitance Boosted Full-Octave LC VCO Based 0.7 to 24 GHz Fractional-N Synthesizer", 2015 IEEE Radio Frequency Integrated Circuits Symposium (2015); pp. 111-114.

Sadhu, B. et al., "A CMOS 3.3-8.4 GHz Wide Tuning Range, Low Phase Noise LC VCO", IEEE 2009 Custom Intergrated Circuits Conference (CICC) (2009); pp. 559-562.

Sadhu, B. et al., "A Linearized, Low-Phase-Noise VCO-Based 25-GHz PLL With Autonomic Biasing", IEEE Journal of Solid-State Circuits (2013); vol. 48:5, pp. 1138-1150.

Sadhu, B. et al., "Capacitor Bank Design for Wide Tuning Range LC VCOs: 850MHZ-7.1GHZ (157%)", IEEE (2010); pp. 1975-1978.

Fang, M. et al., "An Ultra-Low-Power Octave-Tuning VCO IC With a Single Analog Voltage-Controlled Novel Varactor", IEEE Transactions on Circuits and Systems (2022); vol. 69:12, pp. 4751-4760.

Borremans, J. et al., "A Single-Inductor Dual-Band VCO in a 0.06mm2 5.6GHz Multi-Band Front-End in 90nm Digital CMOS", IEEE International Solid State Circuits Conference (2008); pp. 324-326.

Agrawal, A. et al., "Series Resonator Mode Switching for Area-Efficient Octave Tuning-Range CMOS LC Oscillators", IEEE Transactions on Microwave Theory and Techniques (2017); vol. 65:5, pp. 1569-1579.

Chang, C. et al. 'Dual-Resonance Lc-Tank Frequency Divider Implemented With Switched Varactor Bias', Intl. Symp. On VLSI Design, Automation and Test, Apr. 25-28, 2011, 4 pages.

Goel, et al., A Compact 6 Ghz To 12 Ghz Digital PII With Coupled Dual-Lc Tank DCO, Symposium on VLSI Circuits, June, 16-18, 2010, pp. 141-142.

Kossel, et al., LC PLL with 1.2-octave locking range based on mutual-inductance switching in 45-nm SOI CMOS, I EEE Journal of Solid-State Circuits, Mar. 2009, vol. 44, Iss. 2, pp. 436-449.

Lu, et al., Wide Tunning Range 60 GHZVCOand40GHzDCO Using Single Variable Inductor, IEEE Trans. On Circ. and Systems I: Regular Papers, Feb. 2013, vol. 60, Iss. 02, pp. 257-267.

Yu, X. et al., A Transformer-Based Dual-Coupled Triple-Mode CMOS LC-VCO, IEEE TMTT, Jul. 8, 2014, vol. 62, Issue: 9, pp. 2059-2070.

* cited by examiner

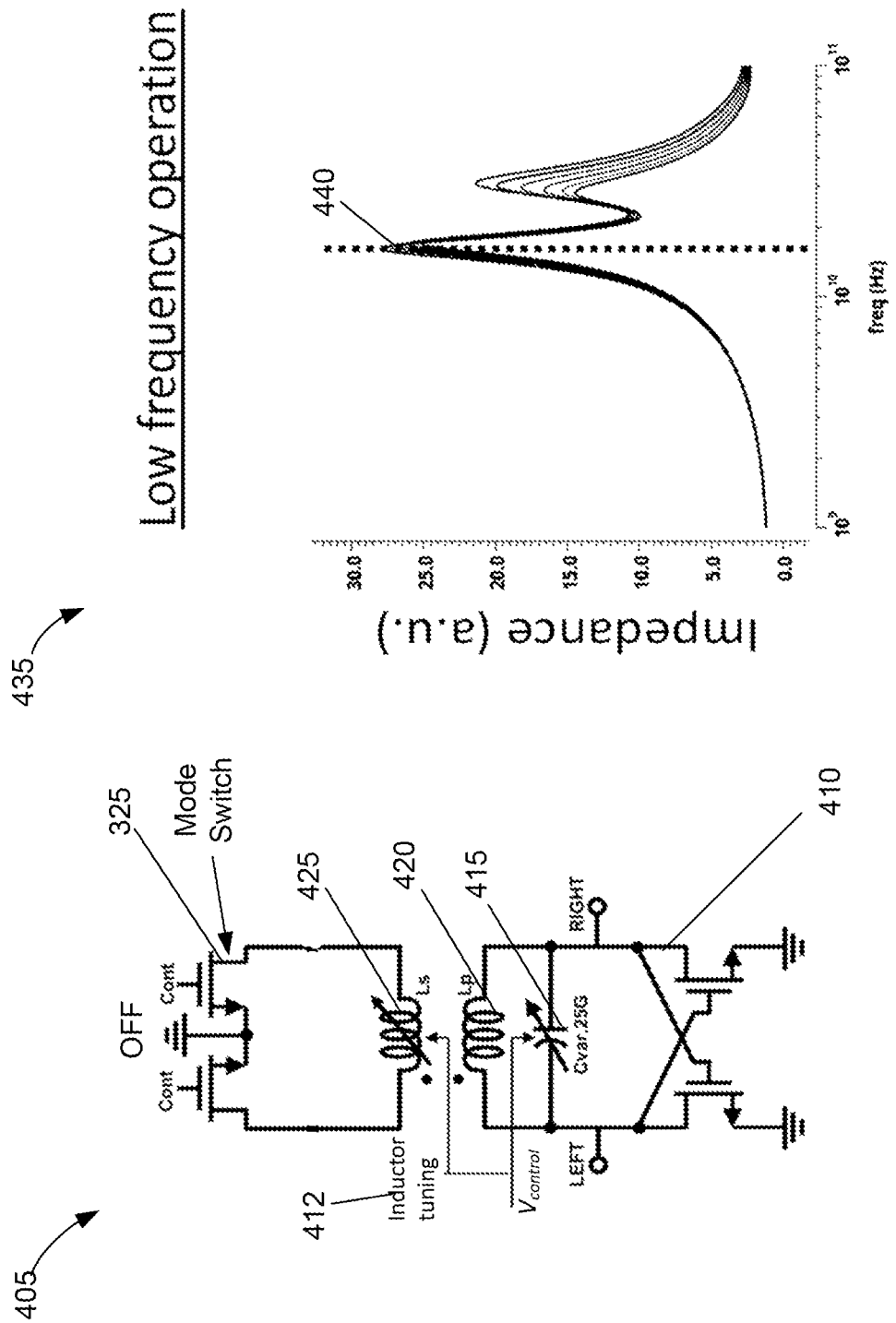

FREQUENCY CONTROL IN A MULTI-MODE VCO

BACKGROUND

Technical Field

The present disclosure generally relates to voltage-controlled oscillators (VCOs), and more particularly, to VCOs with modes of operation at different frequencies.

Description of the Related Art

VCOs are devices that provide an output oscillation frequency that is proportional to an input voltage. Multiple VCOs with optimized varactor banks for a desired frequency may be arranged for operations including, but not limited to, chip-to-chip and memory-to-chip data transfer. The multiple VCOs with optimized varactor banks may be arranged in groups to provide multiple separated oscillation frequencies corresponding to a particular group of the VCOs. Typically, a VCO is tuned by changing the capacitance (e.g., by a varactor and a control voltage) while keeping the inductance constant.

Depending on a desired frequency of oscillation, only some of the VCOs may be activated at a given time. Thus, due to the size of the inductors, multiple VCOs may occupy relatively large areas that may increase power consumption and complicate circuit design. For example, the selection of one of many VCOs is typically carried out by the use of an analog multiplexer (mux). Analog muxes can introduce jitter into the circuit operation. The arrangement of multiple VCOs may be performed with the use of designated conductor areas that may prevent the placement of controlled collapse chip connection (C4) bumps and complicate signal distribution and integrity.

There have been attempts to provide multi-mode VCOs that can operate to provide oscillation frequencies in different ranges. For example, a multi-mode VCO may operate in low frequency mode at a relatively lower frequency range and a high frequency mode that is relatively higher than the low frequency mode. Multi-mode VCOs provide a larger tuning range than single mode VCOs and decrease the overall occupied area of a circuit. The same fractional tuning range may be achieved in all of the frequency modes of operation (e.g., $C_{max}/C_{min}$). However, there is a problem in such multi-mode VCOs regarding different VCO gains for different modes (e.g., different $K_{VCO}$ (Hz/V)).

FIG. 1 is a graph showing gain characteristics ($K_{VCO}$) for three inductance values of a multi-mode VCO. The graph shows frequency output from a varactor control at a given inductance, as varactor tuning is performed to change an oscillation frequency of each operational mode of the multi-mode VCO. In each mode having a given inductance, the $K_{VCO}$ can be expressed as $$\frac{f_{max,1}}{f_{min,1}} = \sqrt{\frac{C_{max}}{C_{min}}}$$

for the first mode, $$\frac{f_{max,2}}{f_{min,2}} = \sqrt{\frac{C_{max}}{C_{min}}}$$

for the second mode, and $$\frac{f_{max,3}}{f_{min,3}} = \sqrt{\frac{C_{max}}{C_{min}}}$$

for the third mode. The slope of each mode shown is different. For example, the third mode (e.g., the range of $f_{min,3}$ to $f_{max,3}$), has a steeper slope than the range of the second mode $f_{min,2}$ to $f_{max,2}$, which in turn is steeper than a slope of the first mode $f_{min,1}$ to $f_{max,1}$. In other words, by changing the inductance, and keeping a ratio of $f_{max}/f_{min}$ and $c_{max}/c_{min}$ constant, substantially more tuning range is obtained at lower inductance values. The relationship between the VCO gain using difference inductance values is $K_{VCO,3} > K_{VCO,2} > K_{VCO,1}$. The different VCO gains for a given mode can be a challenge when a multi-mode VCO is used in systems such as a phased lock loop (PLL), as PLLs are typically designed for a particular gain. The different inductance values of a multi-mode VCO can have an adverse effect on the operation of the PLL. Accordingly, there is a need in multi-mode VCO design to create a structure that overcomes the problems associated with different bandwidth and VCO gain at various modes of VCO operations.

SUMMARY

According to one embodiment, a Voltage-Controlled Oscillator (VCO) includes a cross-coupled transconductance cell. A transformer comprising a primary coil and at least one secondary coil, wherein the primary coil is connected to the cross-coupled transconductance cell. A primary coil varactor is connected to the cross-coupled transconductance cell in parallel to the primary coil. A variable inductive tuning component connected to the at least one secondary coil. A mode switch connected to the at least one secondary coil and configured to select a frequency mode of operation of the VCO by engaging or disengaging the variable inductive tuning component from operation with the primary coil varactor to generate oscillation at a center frequency. The VCO provides substantially similar VCO gain and absolute bandwidth in all frequency modes, which is an advantage over known VCOs.

In an embodiment, which can be combined with the preceding embodiment, the mode switch is configured to control a frequency mode of a multi-mode operation of the VCO. The mode switch may control a high frequency mode, a low frequency mode, and other frequency modes providing flexibility and uniform gain to reduce an area occupied by occupied VCOs. Fewer VCOs are needed, and the reduction in occupied area and power usage results.

In an embodiment, which can be combined with the preceding embodiments, in a first mode the mode switch is ON, and the primary coil varactor is configured to tune the VCO to the center frequency. The high frequency mode enables frequency tuning with a fractional tuning range.

In an embodiment, which can be combined with the preceding embodiments, in a second mode the mode switch is OFF, the primary coil varactor and the variable inductive tuning component are configured to tune the VCO to the center frequency. The low frequency mode has a larger fractional tuning range than in conventional VCOs and the gain of the low frequency mode and the high frequency is approximately equal to each other, unlike conventional VCOs.

In an embodiment, which can be combined with the preceding embodiments, the center frequency of the VCO in the first mode is higher than the center frequency of the VCO in the second mode. A more accurate center frequency is obtained based on a more precise oscillation frequency being used.

In an embodiment, which can be combined with the preceding embodiments, a bias control module configured to generate a programmable bias current to compensate for varying a tank impedance of the VCO. The programmable bias current maintains a constant voltage swing across a plurality of operational modes of the VCO. the programmable bias current prevents damage to the device and less sensitivity to pressure, voltage and temperature variations.

In an embodiment, which can be combined with the preceding embodiments, the variable inductive tuning component includes a secondary coil varactor connected in parallel to the secondary coil. The secondary coil varactor is configured to tune an inductive reactance of the secondary coil. A more accurate center frequency may be obtained.

In an embodiment, which can be combined with the preceding embodiments, when the mode switch is OFF, the primary coil varactor and the secondary coil varactors are controlled with voltages having the same polarity to increase the frequency tuning range and the gain of the VCO. A more accurate center frequency that is less susceptible to issues from swing voltage damage is obtained.

In an embodiment, which can be combined with the preceding embodiments, a gain of the VCO in the first mode is substantially the same as a gain of the VCO in a second mode. The same gain is an advantage of the VCO of the present disclosure, as other components may be provided on a device based on a particular gain, and a near uniform game in high frequency and low frequency modes improves overall efficiency of operation.

In an embodiment, which can be combined with the preceding embodiments, the VCO includes a plurality of variable inductive tuning components, each connected to a corresponding secondary coil of the secondary coils to control a mutual inductance of the transformer. The variable inductive tuning elements may be used to change a reactance of a combination of the variable inductive tuning element with the inductor.

In an embodiment, which can be combined with the preceding embodiments, the VCO includes two or more secondary coils. One or more mode switches are connected to the secondary coils. Multiple switches may be connected to a plurality of successive engagement of the secondary coils.

In an embodiment, which can be combined with the preceding embodiments, the mode switches are configured for successive engagement by a particular one mode switch engaged with a corresponding one of the secondary coils. A more efficient operation is obtained by successive engagement as desired.

In an embodiment, which can be combined with the preceding embodiments, a voltage controller is configured to provide a voltage to the primary coil varactor and the variable inductive tuning component, during an operation when the mode switch is OFF in a first mode. The voltage controller may be output to both the primary and secondary coils.

In an embodiment, which can be combined with the preceding embodiments, a control logic module is arranged between the voltage controller and the variable inductive tuning component. The control logic module is configured to control the primary coil varactor and the variable inductive tuning component in a lower frequency operation, and wherein the control logic is further configured to control the primary coil varactor in a higher frequency operation. The control logic module may assist in prevent damage from VCO swing voltages by controlling bias current. The bias setting current is controlled based on selected mode settings and switch capacitor settings using a table for more accurate results.

In an embodiment, which can be combined with the preceding embodiments, the voltage controller configured to provide a voltage to the primary coil varactor during an operation when the mode switch is OFF in a first mode. The multimode VCO provides more efficient and uniform operation in higher and lower frequency modes.

According to one embodiment, a method of operating a Voltage-Controlled Oscillator (VCO) includes setting a mode select switch condition based on a desired operating frequency. One or more settings of a primary varactor are controlled to oscillate the VCO at a particular center frequency when the mode switch condition is ON. Voltages are applied to the primary varactor and one or more secondary varactors with the same polarities to generate oscillation at the particular center frequency when the mode switch condition is OFF.

In an embodiment, which can be combined with the preceding embodiments, the method includes operating the primary varactor and the one or more secondary varactors in multiple on and off modes. The operation of one or more settings of the secondary varactor connected to the secondary coils having non-enabled mode select switches is controlled.

According to one embodiment, a method of manufacturing a Voltage-Controlled Oscillator (VCO) includes providing a cross-coupled transconductance cell. A transformer having a primary coil and at least one secondary coil is connected via the primary coil to the cross-coupled transconductance cell. A primary coil varactor is connected to the cross-coupled transconductance cell in parallel to the primary coil. A variable inductive tuning component is connected to the at least one secondary coil. A mode switch is connected to the at least one secondary coil. The mode switch is configured to select a frequency mode of operation of the VCO by engaging or disengaging the variable inductive tuning component from operation with the primary coil varactor to generate oscillation at a center frequency. The VCO provides substantially similar VCO gain and absolute bandwidth in all frequency modes, which provides improved accuracy and efficiency over known VCOs.

In an embodiment, which can be combined with the preceding embodiments, a bias control module is connected to the VCO. The bias control module generates a programmable bias current to compensate for varying a tank impedance of the VCO, and to maintain a constant voltage swing across a plurality of operational modes of the VCO. Possible damage to the device is prevent by an accurately selected swing voltage, and the VCO is less sensitive to changes in pressure, voltage and temperature.

BRIEF DESCRIPTION OF THE DRAWINGS

The drawings are of illustrative embodiments. They do not illustrate all embodiments. Other embodiments may be used in addition to or instead. Details that may be apparent or unnecessary may be omitted to save space or for more effective illustration. Some embodiments may be practiced with additional components or steps and/or without all the components or steps that are illustrated. When the same numeral appears in different drawings, it refers to the same or like components or steps.

FIG. 4A illustrates a schematic of a multi-mode VCO configured to perform a low frequency oscillation operation, consistent with an illustrative embodiment.

FIG. 4B is a graph illustrating dual resonance where a strongest peak is used to determine a low frequency oscillation, consistent with an illustrative embodiment.

DETAILED DESCRIPTION

Figure 1:
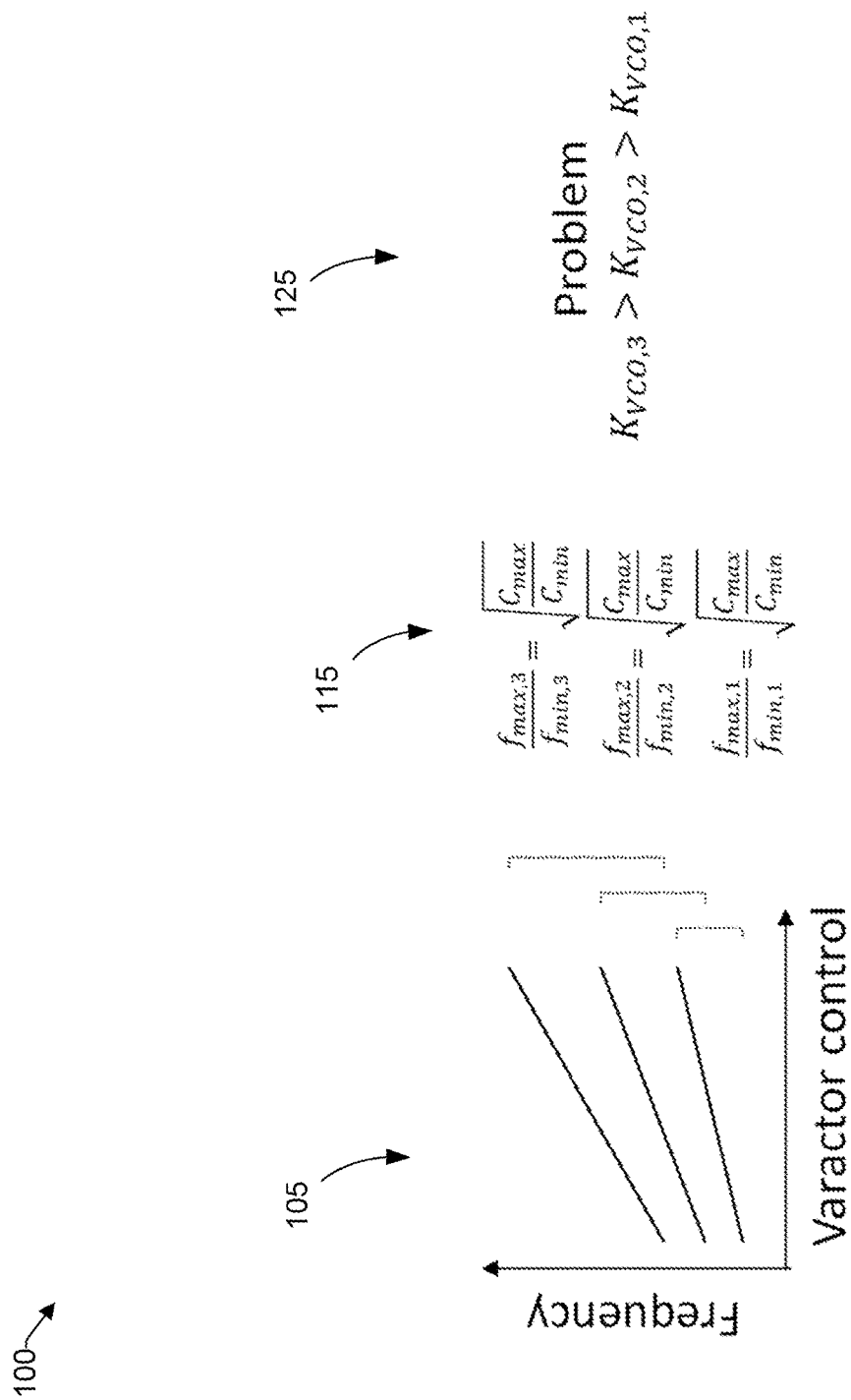
FIG. 1 is a graph showing gain characteristics (KVCO) for three inductance values of a multi-mode VCO.

In the following detailed description, numerous specific details are set forth by way of examples to provide a thorough understanding of the relevant teachings. However, it is to be understood that the present teachings may be practiced without such details. In other instances, well-known methods, procedures, components, and/or circuitry have been described at a relatively high-level, without detail, to avoid unnecessarily obscuring aspects of the present teachings. It is also to be understood that the present disclosure is not limited to the depictions in the drawings, as there may be fewer elements or more elements than shown and described.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

As used herein, the term "high frequency" refers to operations at about 25 GHz, and "low frequency" refers to operations at about 13 GHz. The VCOs and method described herein are not limited to the aforementioned 25 GHz high frequency and a 13 GHz low frequency.

It is to be understood that other embodiments may be used and structural or logical changes may be made without departing from the spirit and scope defined by the claims. The description of the embodiments is not limiting. In particular, elements of the embodiments described hereinafter may be combined with elements of different embodiments.

Overview

The present disclosure provides a multi-mode VCO and method of controlling the VCO that provides a multi-mode inductor turned VCO tuning range with a device that occupies less area than conventional VCOs, and operates with an absolute bandwidth and VCO gain hat is approximate the same in all frequency modes.

Figure 2:
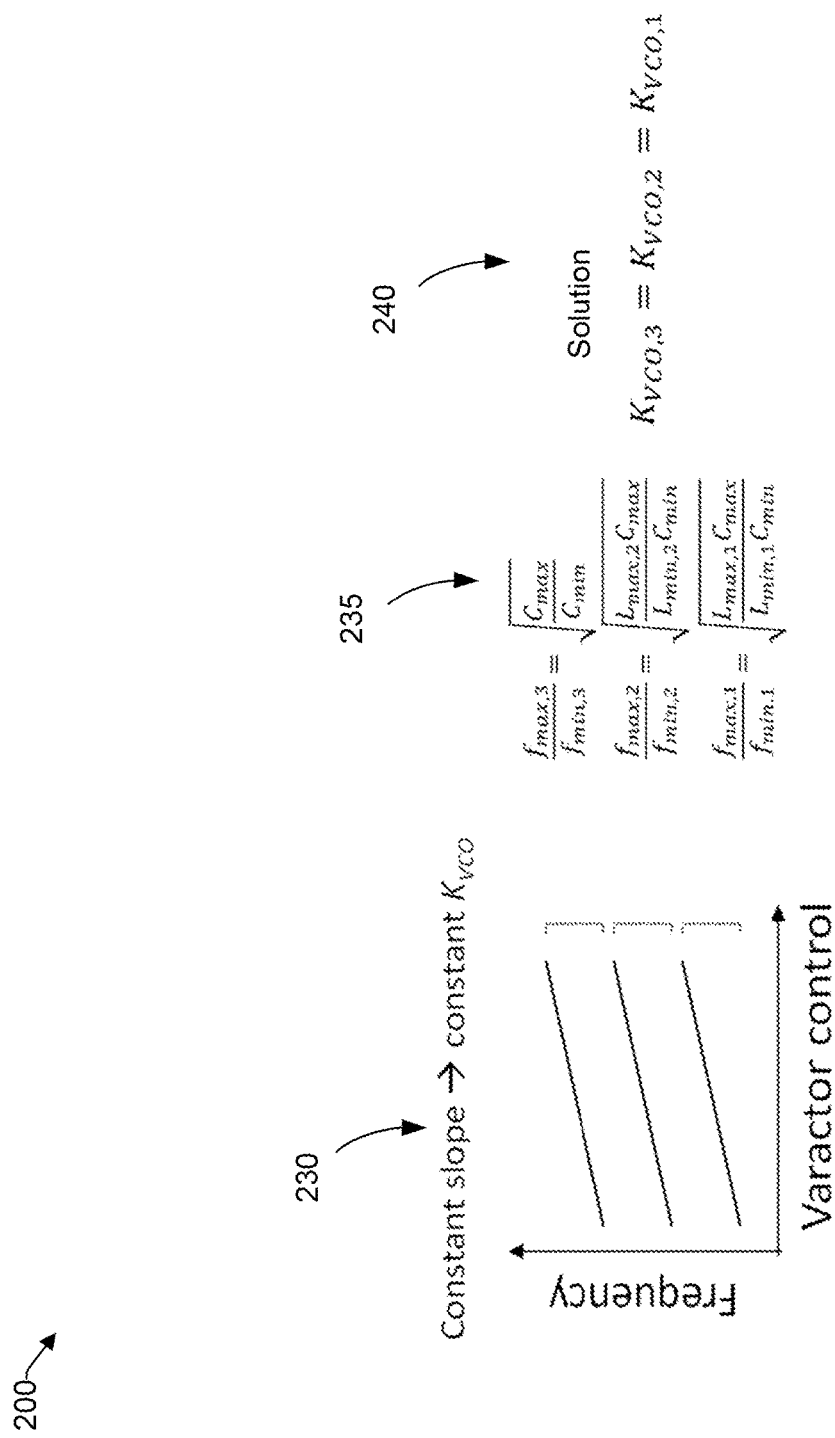
FIG. 2 is a graph showing gain characteristics (KVCO) for three inductance values of a multi-mode VCO, consistent with an illustrative embodiment.

FIG. 2 is a graph showing gain characteristics ($K_{VCO}$) for three inductance values of a multi-mode VCO, consistent with an illustrative embodiment. When compared with a conventionally designed VCO, it is shown that that for difference inductance values, there is a constant slope, which is an improvement over the different slopes shown in FIG. 1. A constant slope results in a constant (e.g., substantially similar) VCO gain characteristics $K_{VCO}$, even when there is a different inductance. A larger fractional bandwidth and higher VCO gain is achieved at lower frequency modes.

In FIG. 2, the constant gain of a VCO of the present disclosure is shown by $K_{VCO,3}=K_{VCO,2}=K_{VCO,1}$, which is an improvement over the inequality shown in FIG. 1 of $K_{VCO,3}>K_{VCO,2}>K_{VCO,1}$. The VCO of the present disclosure provides a more efficient structure, having a smaller footprint, substantially constant gain curves across different frequency, and less complicated circuitry to select and control the varactors. For example, the number of VCO blocks used to cover a specific frequency range can be reduced by the multi-mode structure as disclosed herein.

Figure 3:
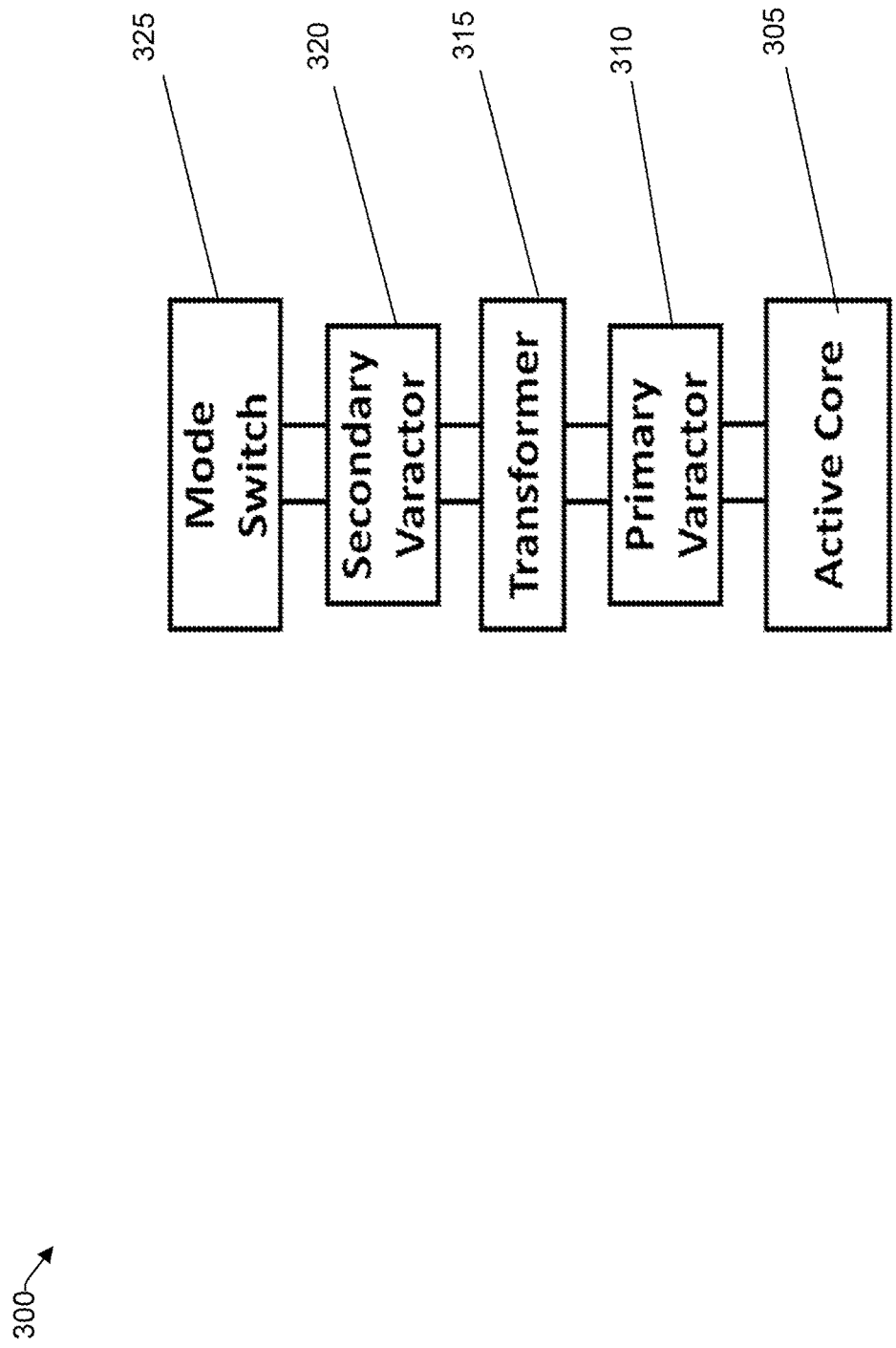
FIG. 3 illustrates a block diagram illustrating a structural arrangement of a multi-mode VCO according to an illustrative embodiment.

FIG. 3 illustrates an arrangement of a multi-mode VCO 300 according to an illustrative embodiment. The structure includes an active core 305, a primary varactor 310, a transformer 315, a secondary varactor 320, and a mode switch. In this embodiment, the multi-mode VCO 300 is configured for dual-mode operation at two different frequency ranges (e.g., a lower frequency and a higher frequency). However, the structure shown in FIG. 3 can include additional transformer coils and modes. The active 305 may include a cross-coupled transconductance cell. A primary varactor 310 control enables frequency tuning of the coil of the transformer 315. A secondary coil of the transformer 315 is tuned by the secondary varactor 320. Dual mode operation is controlled by the mode switch 325.

In a high frequency mode, the primary coil varactor 310 control enables frequency tuning in a fractional tuning range. In a low frequency mode, the primary varactor 310 and the secondary varactor 320 enables frequency tuning with a larger fractional tuning range than conventional dual-mode VCO structures. The VCO structure in FIG. 3 may be referred to as a having a dual tank varactor tuning. Advantages of the structure shown in FIG. 3 include a similar absolute tuning range with both higher and lower frequencies, and a substantially similar VCO gain in a low frequency mode and a high frequency mode. Accordingly, multiple varactors on multiple transformer coils provide additional degrees of freedom and the more constant VCO gain across the VCO tuning range. Moreover, the use of a dual-mode VCO can provide 2 times the area savings. For example, 28 VCOs may be arranged where 56 VCOs were needed with conventional structures. Multi-mode VCO structures with more than two modes may result in even larger area savings. The reduced area also allows for more bumps (e.g., C4 bumps), which in turns improves the power/ground integrity of the structure.

In the example of FIG. 3, the mode switch 325 is a physical switch arranged across the secondary terminals of a transformer. The mode switch 325 enables two distinct inductance values, $L_{LOW}$ and $L_{HIGH}$.

When the mode switch is ON, the VCO operates in high frequency mode. The operating frequency is set to he resonance of $L_{LOW}$ and $C_{var}$ (see FIGS. 4C and 5B).

The tuning range in the high frequency mode is $$\sqrt{\frac{L_{LOW} \times C_{max}}{L_{LOW} \times C_{min}}} = \sqrt{\frac{C_{max}}{C_{min}}}$$

with $C_{max}$ and $C_{min}$ of the varactor.

Typical fractional tuning range is a high tuning range because the center frequency is high.

When mode switch is OFF, the VCO operates in a low frequency mode. The operating frequency is set to the resonance of $L_{HIGH\_var}$ and $C_{var}$.

The tuning range in the low frequency mode is $$\sqrt{\frac{L_{HIGH\_max} \times C_{max}}{L_{HIGH\_min} \times C_{min}}}.$$

Even though the center frequency is low, the higher fractional bandwidth results in high tuning range. In a non-limiting example, a high frequency is about 25 GHz, and a low frequency is about 13 GHz.

EXAMPLE EMBODIMENTS

Figures 4C, 4D:
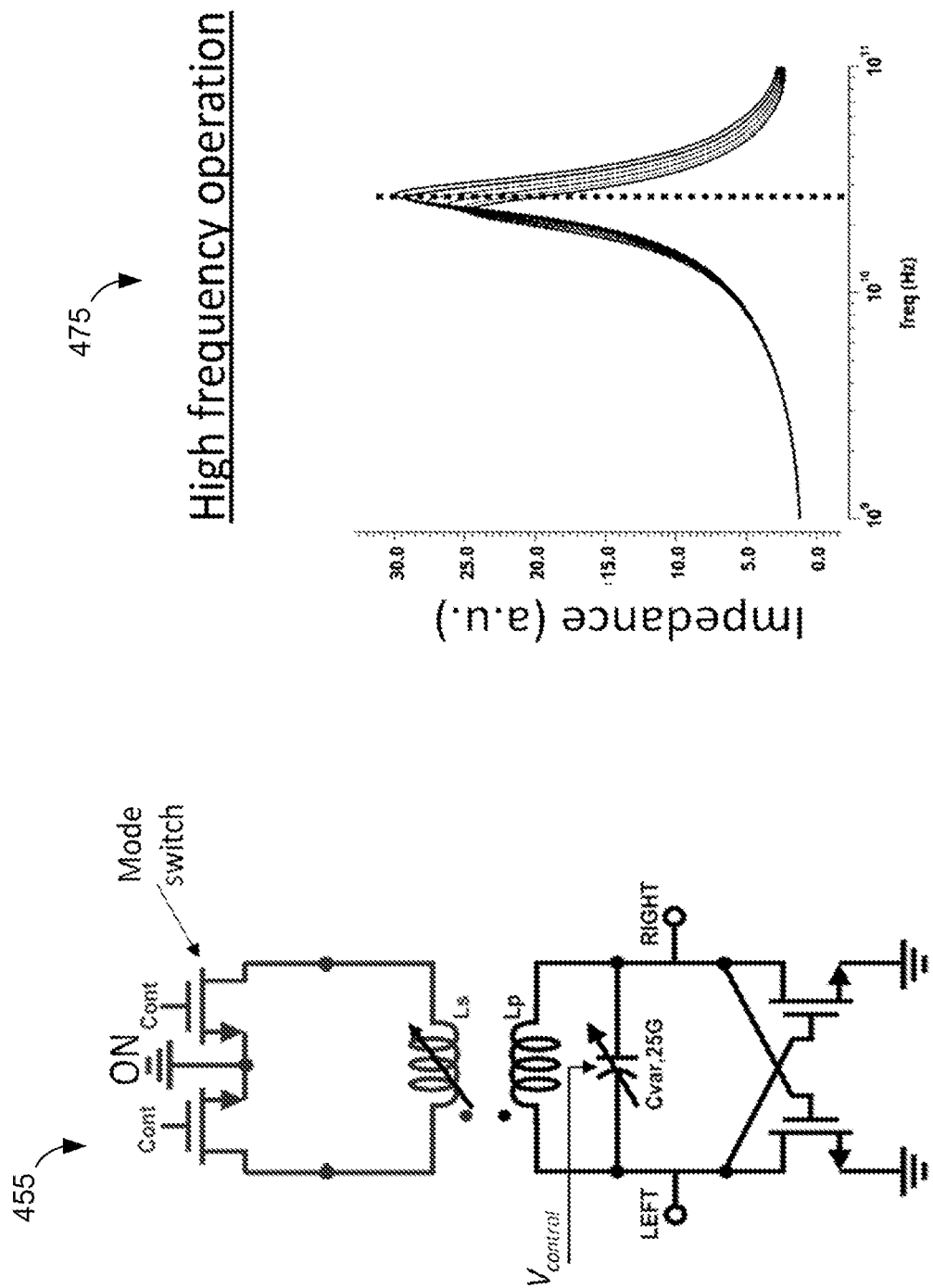
FIG. 4C illustrates a schematic of a multi-mode VCO structure configured to perform a high frequency oscillation operation, consistent with an illustrative embodiment.
FIG. 4D is a graph illustrating an impedance peak of a high frequency oscillation, consistent with an illustrative embodiment.

FIGS. 4A and 4C illustrate schematics of a multi-mode VCO structure configured for operation in respective low frequency and high frequency operation, consistent with an illustrative embodiment. FIGS. 4B and 4D are graphs showing the dual resonance peaks for operation in high frequency and low frequency.

With particular reference to FIG. 4A, the VCO 405 has a transformer-based tank that provides a dual resonance where the strongest peak is used to determine the oscillation frequency. Varactor load tuning is used to adjust the strength and frequency of the resonant peaks. The components of the VCO 405 in this embodiment include a cross-coupled transconductance cell 410. A transformer has a primary coil 420 and at least one secondary coil 425, the primary coil 420 is connected to the cross-coupled transconductance cell 410. A primary coil varactor 415 is connected to the cross-coupled transconductance cell 410 in parallel with the primary coil 420. A variable inductive tuning component (indicated by the arrow going through the coil) is connected to the at least one secondary coil 425. As it is difficult to change the inductance, by using the variable tuning component, the reactance of the combination of the secondary coil 425 and the variable tuning component are used to increase or decrease the overall inductance of the combination. While in FIG. 5A the variable tuning component is shown as a varactor 527, the present disclosure is not limited to the use of a varactor 527.

The mode switch 325 connected to the at least one secondary coil 425. The mode switch 325 is configured to select a frequency mode of operation of the VCO by engaging or disengaging the variable inductive tuning component (e.g., varactor 527) from operation with the primary coil varactor 425 to generate oscillation at a center frequency. It is to be understood that although a single secondary coil 425 is shown in FIG. 4A and (FIG. 5A), the present disclosure is not limited to this configuration shown and described. There may be a plurality of second coils that may be controllable by one or more mode switches. When the mode switch 325 is OFF, the primary coil varactor 425 and the variable inductive tuning component (e.g., varactor 527) are adjusted to have the same polarities to obtain an oscillation at the center frequency. When the mode switch 325 is set to on, the primary varactor settings are set to obtain oscillation at the required center frequency. There is no inductor tuning shown in FIG. 4C, whereas in FIG. 4A when the mode switch 325 is off, there is inductor tuning 412 from a voltage control.

FIG. 4B shows the resonance peaks 440 in a graph of impedance versus frequency. The dotted line shown from the peak 440 in FIG. 4B is a lower frequency (the low frequency operation) is lower than the frequency indicated by the dotted line in FIG. 4D (the high frequency mode). The peak in FIG. 4B is closer to the 10 GHz mark on the graph than in FIG. 4D.

Figure 5A:
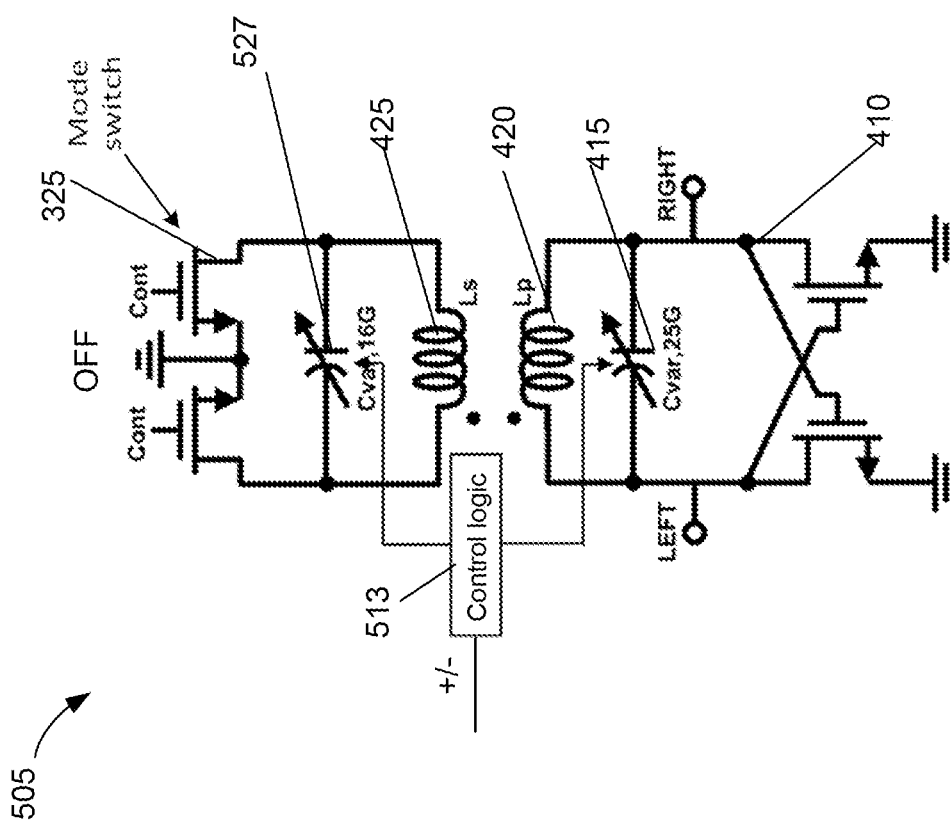
FIG. 5A and FIG. 5B illustrate another configuration of a multi-mode VCO consistent with an illustrative embodiment.
Figure 5B:
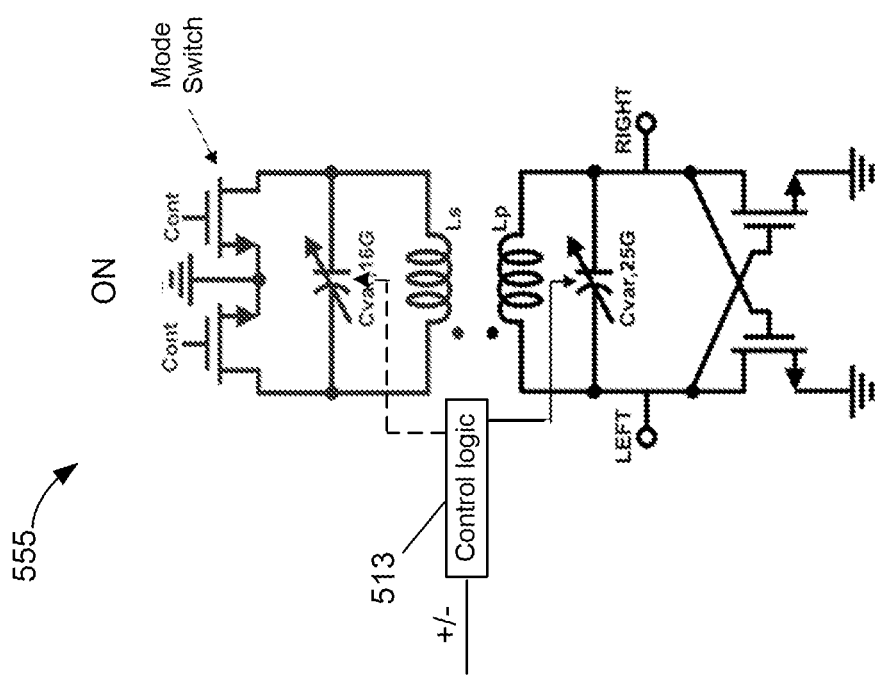

FIGS. 5A and 5B show another configuration of a multi-mode VCO consistent with an illustrative embodiment. FIG. 5A includes the secondary coil varactor 527 as the variable tuning component, and a control logic 513 connected between the primary coil varactor 415 and the secondary coil varactor 527. FIG. 5A shows the mode switch 325 turned off, and FIG. 5B shows the mode switch turned on. In the present disclosure, the control logic 513 may be embodied in a variety of ways. For example, an invertor may be used. Also a VCO bias control 615 (FIG. 6) may be used, as the quality factor of the tank varies between the two modes and across the tuning range causing variation in the tank impedance. A programmable bias current maybe be controlled based on selected mode and capacitor setting as discussed with reference to FIG. 6 below.

Figure 6:
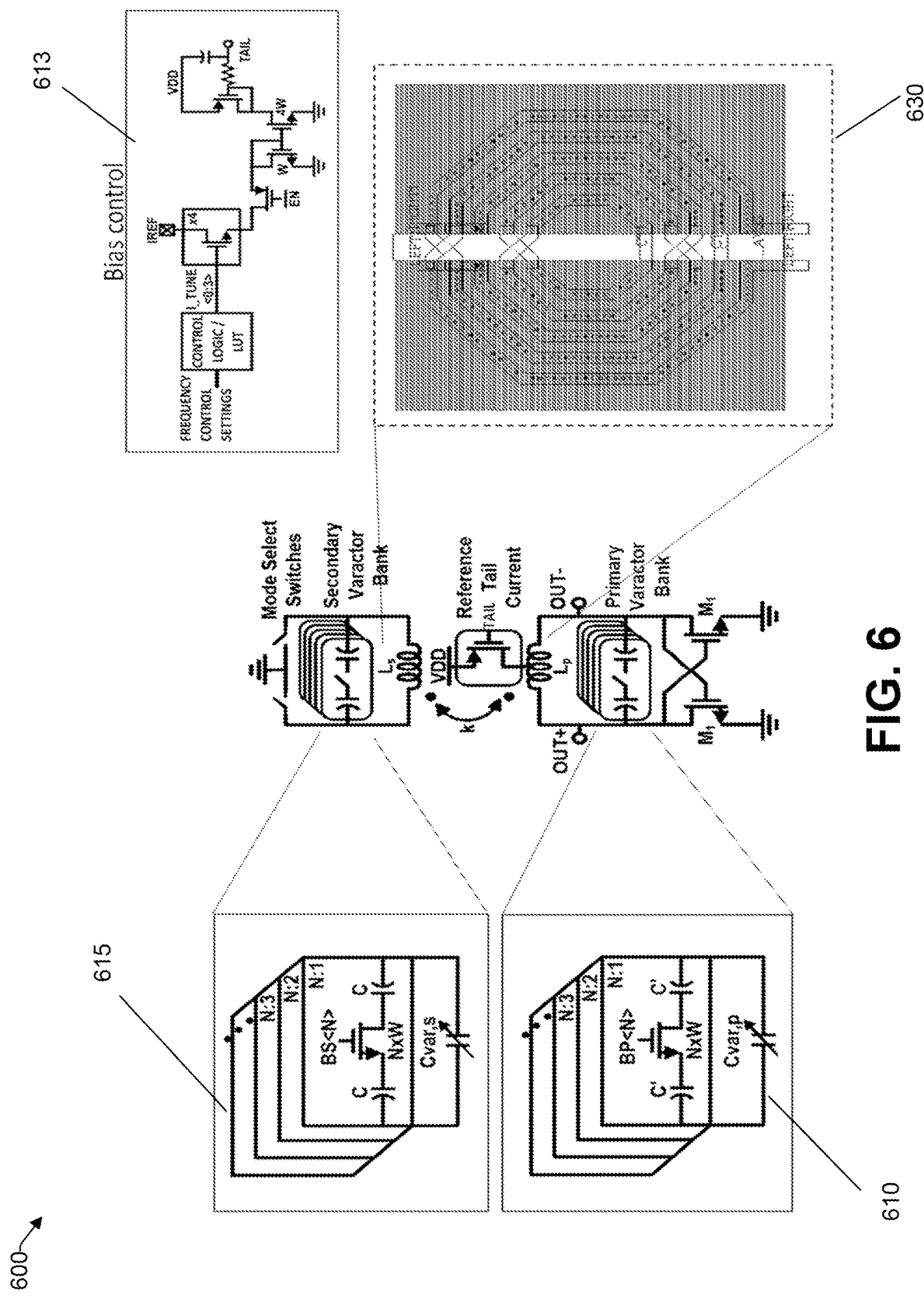
FIG. 6 illustrates is a schematic of a dual-mode VCO with a programmable bias control, consistent with an illustrative embodiment.

FIG. 6 is a schematic of a dual-mode VCO with a programmable bias control, consistent with an illustrative embodiment. There is shown a primary varactor bank 610, second varactor bank 615, programmable bias control 613, and the arrangement 613 of the primary and secondary coils. As previously discussed, the quality factor of the tank varies between the two modes (high and low frequency) and across the tuning range causing variation in the tank impedance.

The VCO voltage swing is proportional to the tank impedance and the bias current. A high VCO swing may result in device breakdown. A low VCO swing may result in start-up issues in pressure, voltage, temperature (PVT) variations.

To remedy the problems with shift VCO swings, there is a programmable bias control 613 to maintain a more constant VCO swing, For example, the output swing=iBias*Zload, with I being the bias current and Z is the frequency (LC load). As the tuning operations take place, the Zload changes because the tank impedance caries. The programmable bias control 613 sets the iBias current to maintain a constant amplitude despite the varying tank impedance across the tuning range. This programmable bias control 613 reduces the sensitivity to process, voltage temperature (PVT) variations. The programmable bias current is controlled based on the selected mode setting and switched capacitor setting using digital logic in a look up table.

Example Process

Figure 7:
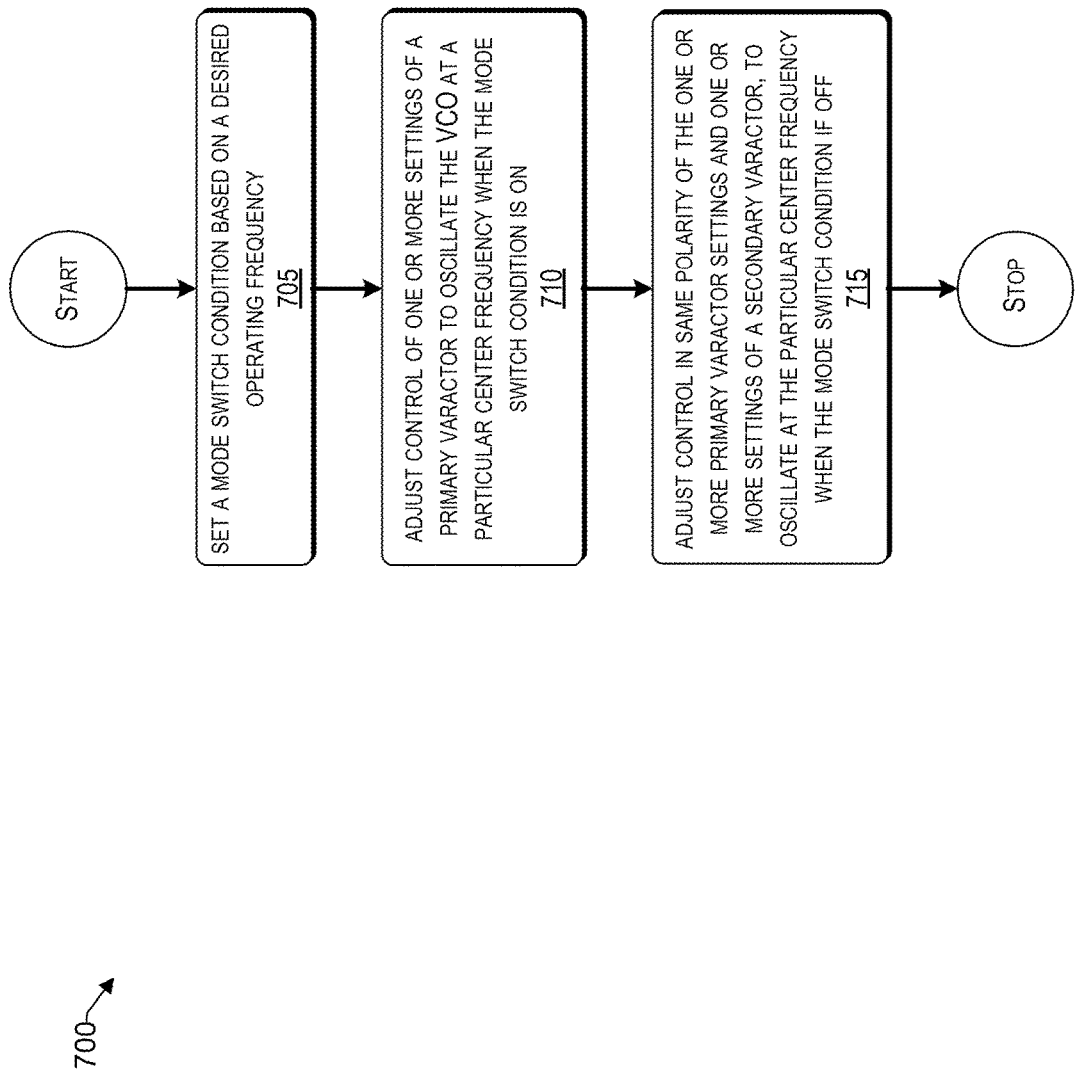
FIG. 7 is a flowchart illustrating operations for a method of VCO control, consistent an illustrative embodiment.

With the foregoing overview of the example architecture, it may be helpful now to consider a high-level discussion of an example process. To that end, FIG. 7 is a flowchart illustrating a method of operating a Voltage-Controlled Oscillator (VCO), consistent with an illustrative embodiment. It is to be understood that the process shown and described is provided for illustrative purposes and not bay way of limitation.

FIG. 7 is shown as a collection of blocks, in a logical order, which represents a sequence of operations that can be implemented in a combination thereof. A mode select switch condition is set based on a desired operating frequency (705). For example, the mode switch 325 shown in FIGS. 4A and 4C may be set to OFF for a lower frequency operation, and ON for a higher frequency operation. The graph in FIG. 4B shows two peaks and one is higher in frequency. The mode switch 325 enables two distinct inductance values ($L_{Low}$ and $L_{High}$).

One or more settings of a primary varactor are adjusted to oscillate the VCO at a particular center frequency when the mode switch condition is ON (710). When the mode switch is one, a high frequency mode is selected. The operational frequency is set according to the resonance of $L_{Low}$ and $C_{VAR}$ (the primary coil varactor).

Voltages with the same polarities are applied to the primary varactor and one or more secondary varactors to generate oscillation at the particular center frequency when the mode switch condition is OFF (715). The polarities are to be the same so that he current flows in the same direction and is used to obtain oscillation at the center frequency.

Although the method in FIG. 7 now ends, it is to be understood that multiple modes may be used. For a given mode, the secondary varactor setting for secondary coils having that are not enabled. The primary varactor settings and all of the secondary varactor are set to have polarities in the same direction to obtain oscillation at a desired center frequency.

CONCLUSION

The descriptions of the various embodiments of the present teachings have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing has described what are considered to be the best state and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications, and variations that fall within the true scope of the present teachings.

While NFETS and PFETS are illustrated and/or discussed in some of the examples herein, these transistors were provided by way of example only, and not by way of limitation. It will be understood, based on the concepts disclosed herein, that other types of insulated-gate field effect transistors (IGFET) with complementary logic may be used as well. For example, any FETS from columns III-V of the periodic table, including carbon nanotube FETS, and/or multigate devices could be used as well to implement the structures described herein. In some embodiments, bipolar transistors (e.g., PNP or NPN), and/or BiCMOS can be used instead of MOS transistors.

The components, operations, steps, features, objects, benefits, and advantages that have been discussed herein are merely illustrative. None of them, nor the discussions relating to them, are intended to limit the scope of protection. While various advantages have been discussed herein, it will be understood that not all embodiments necessarily include all advantages. Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

Numerous other embodiments are also contemplated. These include embodiments that have fewer, additional, and/or different components, steps, features, objects, benefits and advantages. These also include embodiments in which the components and/or steps are arranged and/or ordered differently.

While the foregoing has been described in conjunction with exemplary embodiments, it is understood that the term "exemplary" is merely meant as an example, rather than the best or optimal. Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any such actual relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments have more features than are expressly recited in each claim. Rather, as the following claims reflect, the inventive subject matter lies in less than all features of a single disclosed embodiment. Thus, the following claims are hereby incorporated into the Detailed Description, with each claim standing on its own as a separately claimed subject matter.

What is claimed is:

1. A Voltage-Controlled Oscillator (VCO) comprising:
   a cross-coupled transconductance cell;
   a transformer comprising a primary coil and at least one secondary coil, wherein the primary coil is connected to the cross-coupled transconductance cell;

a primary coil varactor connected to the cross-coupled transconductance cell in parallel to the primary coil;
a variable inductive tuning component connected to the at least one secondary coil; and
a mode switch connected to the at least one secondary coil and configured to select a frequency mode of operation of the VCO by engaging or disengaging the variable inductive tuning component from operation with the primary coil varactor to generate oscillation at a center frequency, wherein the mode switch provides a ground voltage at an end of the at least one secondary coil, when the mode switch is ON.

2. The VCO according to claim 1, wherein the mode switch is configured to control a frequency mode of a multi-mode operation of the VCO.

3. The VCO according to claim 2, wherein in a first mode the mode switch is ON, and the primary coil varactor is configured to tune the VCO to the center frequency.

4. The VCO according to claim 2, further comprising a second mode where the mode switch is OFF, wherein the primary coil varactor and the variable inductive tuning component are configured to tune the VCO to the center frequency.

5. The VCO according to claim 4, wherein the center frequency of the VCO in a first mode is higher than the center frequency of the VCO in the second mode.

6. The VCO according to claim 4, further comprising a bias control module configured to generate a programmable bias current to compensate for varying a tank impedance of the VCO, wherein the programmable bias current is configured to maintain a constant voltage swing across a plurality of operational modes of the VCO.

7. The VCO according to claim 4, wherein:
the variable inductive tuning component includes a secondary coil varactor connected in parallel to the secondary coil; and
the secondary coil varactor is configured to tune an inductive reactance of the secondary coil.

8. The VCO according to claim 7, wherein when the mode switch is OFF, the primary coil varactor and the secondary coil varactor are each configured to be controlled with voltages having a same polarity to increase a frequency tuning range and a gain of the VCO.

9. The VCO according to claim 8, wherein the gain of the VCO in a first mode is substantially the same as a gain of the VCO in a second mode.

10. The VCO according to claim 9, further comprising a plurality of variable inductive tuning components, each connected to a corresponding secondary coil of the secondary coils to control a mutual inductance of the transformer.

11. The VCO according to claim 1, wherein:
the at least one secondary coil comprises two or more secondary coils; and
one or more mode switches are connected to the secondary coils.

12. The VCO according to claim 11, wherein the one or more mode switches are configured for successive engagement by a particular one mode switch engaged with a corresponding one of the secondary coils.

13. The VCO according to claim 1, further comprising a voltage controller configured to provide a voltage to the primary coil varactor and the variable inductive tuning component, during an operation when the mode switch is OFF in a first mode.

14. The VCO according to claim 13, further comprising a control logic module arranged between the voltage controller and the variable inductive tuning component, wherein:

the control logic module is configured to control the primary coil varactor and the variable inductive tuning component in a lower frequency operation; and
the control logic module is further configured to control the primary coil varactor in a higher frequency operation.

15. The VCO according to claim 1, further comprising a voltage controller configured to provide a voltage to a node of the primary coil varactor during an operation when the mode switch is OFF in a first mode.

16. A method of operating a Voltage-Controlled Oscillator (VCO) having a mode select switch, a primary varactor, and one or more secondary varactors, the method comprising:
setting a condition of the mode select switch based on a desired operating frequency;
controlling one or more settings of the primary varactor to oscillate the VCO at a particular center frequency when the mode select switch condition is ON; and
applying voltages with a same polarity to the primary varactor and one or more secondary varactors to generate oscillation at the particular center frequency when the mode select switch condition is OFF, wherein the mode switch provides a ground voltage at an end of a secondary coil, when the mode switch is ON.

17. The method according to claim 16, further comprising:
operating the primary varactor and the one or more secondary varactors in multiple ON and OFF modes; and
controlling the operation of one or more settings of the one or more secondary varactors connected to the secondary coils having non-enabled mode select switches.

18. The method according to claim 16, further comprising adjusting the primary varactor settings and secondary varactor settings with a same polarity, such that oscillation of the VCO at the particular center frequency is generated.

19. A method of manufacturing a Voltage-Controlled Oscillator (VCO), the method comprising:
providing a cross-coupled transconductance cell;
providing a transformer comprising a primary coil and at least one secondary coil, wherein the primary coil is connected to the cross-coupled transconductance cell;
connecting a primary coil varactor to the cross-coupled transconductance cell in parallel to the primary coil;
connecting a variable inductive tuning component to the at least one secondary coil; and
providing a mode switch connected to the at least one secondary coil, selecting a frequency mode of operation of the VCO by engaging or disengaging the variable inductive tuning component from operation with the primary coil varactor; and
generating oscillation at a center frequency of the VCO, wherein the mode switch provides a ground voltage at an end of the at least one secondary coil, when the mode switch is ON.

20. The method according to claim 19, further comprising tuning the VCO center frequency through the primary coil varactor when the mode switch is ON in a first mode.

21. The method according to claim 20, further comprising:
tuning the VCO center frequency through the primary coil varactor and the variable inductive tuning component when the mode switch is OFF in a second mode.

22. The method according to claim 21, further comprising:
- generating a programmable bias current to compensate for varying a tank impedance of the VCO via a bias control module; and
- maintaining a constant voltage swing across a plurality of operational modes of the VCO via the bias control module.

* * * * *